United States Patent [19]

Baumgartner et al.

[11] Patent Number: 5,272,460
[45] Date of Patent: Dec. 21, 1993

[54] CURRENT AND VOLTAGE TRANSFORMER FOR A METAL-ENCAPSULATED, GAS-INSULATED HIGH-VOLTAGE INSTALLATION

[75] Inventors: Rudolf Baumgartner, Gebenstorf; Ken Y. Haffner, Baden; Heinz Hägeli, Unterehrendingen; Andrezej Kaczkowski, Würenlingen, all of Switzerland

[73] Assignee: ASEA Brown Boveri Ltd, Switzerland

[21] Appl. No.: 866,003

[22] Filed: Apr. 9, 1992

[30] Foreign Application Priority Data

Apr. 22, 1991 [CH] Switzerland .............. 01195/91

[51] Int. Cl.$^5$ ............................................. H01F 27/02
[52] U.S. Cl. .............................. 336/96; 336/84 R; 336/84 C
[58] Field of Search ............... 336/84 C, 84 R, 90, 336/92, 94, 96, 179, 195, 58

[56] References Cited

U.S. PATENT DOCUMENTS

| | | | |
|---|---|---|---|
| 4,731,599 | 3/1988 | Preissinger | 336/84 C |
| 4,845,453 | 7/1989 | Preissinger et al. | 336/84 C |

FOREIGN PATENT DOCUMENTS

| | | |
|---|---|---|
| 215728 | 8/1986 | European Pat. Off. . |
| 1827081 | 2/1961 | Fed. Rep. of Germany . |
| 1194517 | 10/1965 | Fed. Rep. of Germany . |
| 2325441 | 11/1974 | Fed. Rep. of Germany . |
| 2363933 | 3/1980 | Fed. Rep. of Germany . |
| 2325448 | 6/1981 | Fed. Rep. of Germany . |
| 3313192 | 10/1984 | Fed. Rep. of Germany . |
| 3544508 | 6/1987 | Fed. Rep. of Germany . |
| 3712190 | 10/1988 | Fed. Rep. of Germany . |
| 630466 | 6/1982 | Switzerland . |

OTHER PUBLICATIONS

Lebeda, Stanislav; Machler, Adrian: Rogowski-Spulen zur exakten Strommessung bei der Elektro-denregelung von Lichtbogenschmelzofen. In: Brown Boveri Mitt., Oct. 11, 1981, S.387-389.

Primary Examiner—Leo P. Picard
Assistant Examiner—Bot Ledynh
Attorney, Agent, or Firm—Ostrolenk, Faber, Gerb & Soffen

[57] ABSTRACT

The current and voltage transformer (10, 11) is intended for a metal-encapsulated, gas-insulated high-voltage installation. It has an annular supporting body (13) which can be fixed inside the metal encapsulation (7) and is used for holding a current sensor and a voltage sensor. The current sensor, held on the supporting body (13), is constructed as a toroidally wound coil (14) and the voltage sensor, held on the supporting body (13), is constructed as a hollow-cylindrical measurement electrode (15). After fitment in the installation, the coil (14) and measurement electrode (15) concentrically surround a current conductor (5) of the installation. This current and voltage transformer is intended to have small dimensions and is intended to be capable of fitment without problems at any point in the installation. This is achieved in that the coil (14) is wound in the manner of a Rogowski coil on an annular core (29) of non-ferromagnetic material, of essentially rectangular cross-section when cut in the axial direction, having a small radial dimension in comparison with the radius of the core (29) and with its axial extent, and is arranged in a hollow-cylindrical space (19) in the supporting body (13), which space is shielded against electric fields and whose boundary wall providing the electrical shielding is connected, after fitment, to the potential of the metal encapsulation (7).

13 Claims, 1 Drawing Sheet

CURRENT AND VOLTAGE TRANSFORMER FOR A METAL-ENCAPSULATED, GAS-INSULATED HIGH-VOLTAGE INSTALLATION

BACKGROUND OF THE INVENTION

1. Field of the invention

The invention is based on a current and voltage transformer for a metal-encapsulated, gas-insulated high-voltage installation having an annular supporting body which can be fixed inside the metal encapsulation and is used for holding a current sensor and a voltage sensor and in which the current sensor, held on the supporting body, is constructed as a toroidally wound coil and the voltage sensor, held on the supporting body, is constructed as a hollow-cylindrical measurement electrode and in which, after fitment in the installation, the coil and measurement electrode concentrically surround a current conductor of the installation.

2. Discussion of Background

In this case, the invention makes reference to a prior art as is provided, for example by DE-A1-2,325,441. A transducer, which is shown in FIG. 1 of this patent publication and is intended for fitment in a metal-encapsulated, gas-insulated switching installation, contains a metallic tube, which is attached in an electrically insulated manner to a mounting projection, and current transformer cores with secondary windings fitted thereon. The metallic tube and the current transformer cores which are supported by said metallic tube and have the secondary windings fitted thereto, are arranged coaxially with respect to a current conductor of the installation, inside the metal encapsulation. The metallic tube forms, with the current conductor, the upper voltage capacitor of a capacitive divider, at whose output a signal is present which corresponds to the voltage on the current conductor. Signals can be picked off on the secondary windings which signals correspond to the current flowing in the current conductor. The current conductor cores have large dimensions and additionally contain predominantly ferromagnetic material, of high specific gravity. Thus the current and voltage transformer according to the prior art is not only very space-consuming but should additionally be of particularly robust construction, because of its high weight.

SUMMARY OF THE INVENTION

The invention, as it is specified in patent claim 1, is based on the object of specifying a current and voltage transformer for metal-encapsulated, gas-insulated high-voltage installations which has small dimensions and can be fitted without problems at any points in the installation.

The current and voltage transformer according to the invention is distinguished by having a dimension in the direction of the encapsulation diameter, in the region of the encapsulation wall, which is negligibly small in comparison with the diameter of the metal encapsulation. It can thus be fitted at virtually any points inside the encapsulation, without any significant adverse effect on the insulation separation.

A preferred exemplary embodiment of the invention and the further advantages which can be achieved thereby are explained in more detail in the following text, on the basis of the drawings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
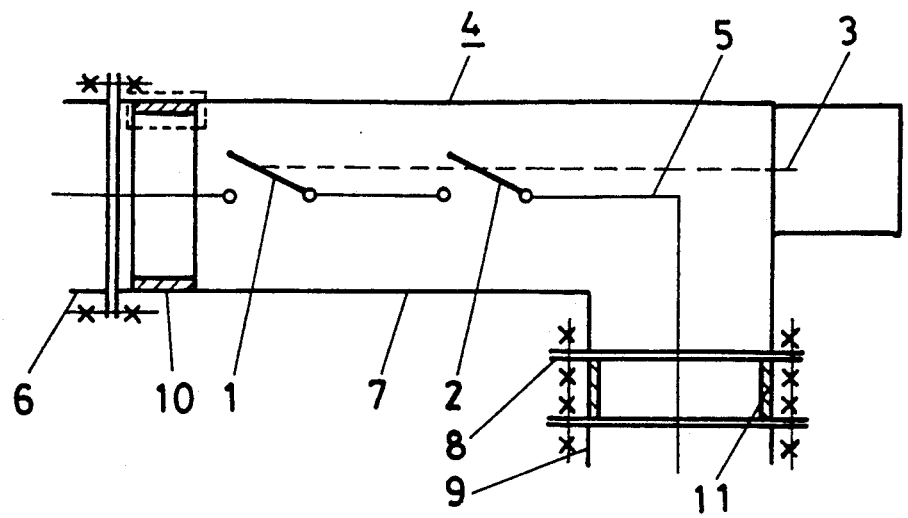
FIG. 1 shows a plan view onto a centrally guided section through a part of a metal-encapsulated, gas-insulated high-voltage switching installation having current and voltage transformers according to the invention.

Referring now to the drawings, wherein like reference numerals designate identical or corresponding parts throughout the several views, in FIG. 1, a part of a metal-encapsulated, gas-insulated high-voltage switching installation, containing a power circuit breaker with switching points 1, 2 and a drive 3, is shown. In this case, the tubular metal encapsulation, which is at ground potential and is designated by the reference numeral 4, is filled with an insulating gas, such as especially $SF_6$, at a pressure of a few bars. Arranged inside the metal encapsulation 4 is a current conductor 5, extending along its tube axis. This current conductor is supported on insulators which are not shown, are flanged in between encapsulation sections 6, 7 and 7, 8 and 8, 9 respectively and preferably result in containment of the insulation gas. Current and voltage sensors of current and voltage transformers 10, 11 are provided inside the metal encapsulation 4. These sensors surround the current conductor 5 concentrically and have the same axis as the parts of the metal encapsulation 4 holding them, that is to say as a part of the encapsulation section 7 and as the encapsulation section 8. If the metal encapsulation 1 contains more than one current conductor, the sensors of the current and voltage transformers still surround the associated current conductor concentrically but do then not have the same axis as the metal encapsulation.

The sensors of the current and voltage transformers 10, 11, which are integrated into supporting bodies which are not especially emphasized, have only a small dimension at right angles to the tube axis in comparison with the diameter of the tubular metal encapsulation 4. The sensors, like for example those of the current and voltage transformer 10, can thus be pushed into the metal encapsulation 4 at virtually any location without any significant adverse effect on the insulation separation, and can be fixed by suitable measures, such as by clamping or screwing. However, it is also possible—as is shown in the case of the sensors of the current and voltage transformer 11—to fit the supporting body between two flanges of the metal encapsulation 4 and to fix it in a gas-tight manner by means of screws. In this case, as can be seen from FIG. 1, the fixed supporting body can be integrated into an encapsulation section. However, if required, an insulator, which supports the current conductor 5 and is attached between two flanges, can be used for holding the sensors.

Figure 2:
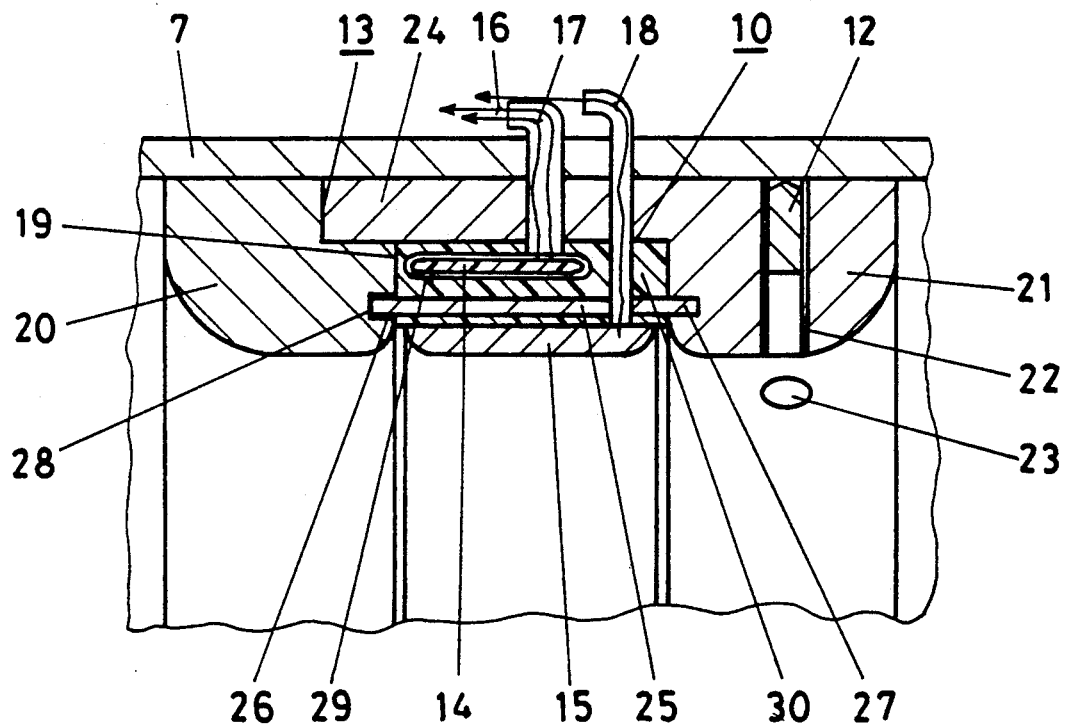
FIG. 2 shows a plan view onto a part, marked by a border, of a current and voltage transformer according to FIG. 1.

From FIG. 2, the construction and arrangement of the current sensor and of the voltage sensor of the current and voltage transformer 10 can be seen. The part of the current and voltage transformer 10 which is shown enlarged in this figure contains essentially one annular supporting body 13, which is clamped in the metal encapsulation—for example by screws 12 which are guided radially outwards with respect to the encapsulation part 7—a toroidally wound annular coil 14 as the current sensor, a hollow-cylindrical measurement electrode 15 as the voltage sensor and shielded signal lines 16, 17 and 18, which are guided in a gas-tight manner out of the metal encapsulation to evaluation electronics of the current and voltage transformer, which are not shown. In these evaluation electronics, measured values are formed from the signals emitted by the sensors, which values correspond to the current flowing in the current conductor 5 or the voltage on the said current conductor 5.

The supporting body 13 contains a space 19, surrounding the current conductor 5 in the form of an annulus, in which the coil 14 is arranged. The space 19 is bounded on its two end faces by two shielding electrodes 20, 21 which surround the current conductor 5 in the form of a torus. The shielding electrode 21 has holes 22, 23, which can be closed, for holding the screws 12 and an annular projection 24, which rests on the inner surface of the encapsulation part 7 and fits into the shielding electrode 20, forming the supporting body 13. The projection 24 bounds the annular space 19 on its surface facing the metal encapsulation while, in contrast, the space 19 is bounded on its surface facing the current conductor 5 by a laminar annular shielding electrode 25. The one end face of the shielding electrode 25 is held in an electrically conductive manner on the shielding electrode 21 and its opposite end face is held in an electrically insulating manner on the shielding electrode 20. The shielding electrodes 20, 21 and 25 preferably consist of the same material as the metal encapsulation, for example of aluminum, and are at the same electrical potential as the metal encapsulation. In consequence, the space 19 is shielded with respect to the influence of electrical interference fields and virtually error-free signals are thus emitted from the coil 14 during measurement in the installation, under operating conditions.

Particularly good shielding of the coil 14 is achieved if at least one of the two shielding electrodes 20, 21 has a material recess, surrounding the current conductor 5 in the form of an annulus, into which recess one of the two end faces of the shielding electrode 25 is fitted. In particular, it has been proven in this case for in each case one material recess, which is constructed as an annular slot 26, 27 and extends in the direction of the tube axis, to be fitted into both the shielding electrode 20 and into the shielding electrode 21 and for the one end face, which is insulated for example by means of an insulating material film 28, of the shielding electrode 25 to be supported in the one material recess, for example the slot 26, and for the opposite, insulationfree end face of the shielding electrode 25 to be supported in the other material recess, for example the slot 27.

The coil 14 is wound in the manner of a Rogowski coil on an annular core 29 of nonferromagnetic material. When cut in the axial direction, the core 29 has an essentially rectangular cross-section and is of only very small size in comparison with its radius and its axial extent in the radial direction. In the case of a radius of, for example, 140 mm and an axial longitudinal extent of, for example, 100 mm, it typically has a thickness of only 5 mm. In consequence, asymmetries in the magnetic field of the current to be measured are compensated for and the influence of undesired external fields is simultaneously minimized. The space 19 holding the coil 14 is filled with an annular insulating body 30, by means of which the coil 14 is fixed on the supporting body 13.

The insulating body 30 simultaneously fixes the shielding electrode 25 and supports the measurement electrode 15 on its inner surface. The insulating body 30 and the core 29 of the coil 14 contain a predominantly isotropic material. This ensures that the insulating body 30 and the core 29 expand and contract evenly in all directions in the event of temperature changes. The geometry of the coil 14 and of the measurement electrode 15 are thus altered linearly in the event of temperature changes. This change can easily be compensated for by continuous temperature monitoring of the sensors of the current and voltage transformer 10, 11 and by continuous matching, resulting from this monitoring, of the evaluation electronics.

A particularly high measurement accuracy can be achieved if the material of the insulating body 30 and of the core 29 of the coil 14 have a coefficient of thermal expansion matched to the material of the shielding electrodes 20, 21, 25 and of the metal encapsulation 4. A casting compound filled with small glass spheres, especially on the base of an epoxy resin, has been well proven as a material for the insulating body 30 and/or the core 29. A non-ferromagnetic metal can also be used as the material for the core 29. Aluminum is especially suitable for this purpose, since it heavily damps voltage peaks induced at high frequencies, and since it simultaneously has a coefficient of thermal expansion corresponding to the material used in the insulating body 30 and to the material used in the metal encapsulation 4.

The sensor of the current and voltage transformers 10, 11 can be manufactured in a simple manner by casting in premounted parts with a casting compound which leads, after curing, to the material of the insulating body 30. During manufacture, the prefabricated coil 14 is initially supported in the horizontally supported shielding electrode 21 by means of insulating spacers in such a manner that it assumes the desired position. In this case, the signal lines 16, 17 are guided through the shielding electrode 21, in a manner which is proof against casting resin, by means of ducts which are not shown. The annular shielding electrode 25, which is, for example, 3 mm thick, is pushed by means of one of its two end faces into the slot 27 and the measurement electrode 15, whose signal line 18 is guided through the shielding electrode 21 in a manner corresponding to the signal lines 16 and 17, is arranged at a short distance from and concentrically with respect to the electrode 25. Thereafter, the shielding electrode 20 is guided onto the shielding electrode 21 and the insulated end face of the shielding electrode 20 is pushed into the slot 26 of said shielding electrode 20. The space 19, which is formed in this way and holds the coil 15, is sealed in a manner which is proof against a casting resin on the abutting joint of the two shielding electrodes 20, 21 and on the two insulation separations remaining between the measurement electrode 15 and the shielding electrodes 20, 21, and is subsequently filled, via an inlet channel which is not shown, with a curable casting compound, such as a casting resin on the base of epoxide. After curing of the casting compound, the sensor of the current and voltage transformers 10, 11 is then complete and, after minor finishing work, can be fitted into the metal-encapsulated, gas-insulated installation.

The coil 14 supplies a signal which is proportional to the change with respect to time of the current flowing in the current conductor 5, which signal, because of the suitably arranged shielding, is free of the influences of undesired external fields and of transient processes occurring in the installation and which is integrated in the evaluation electronics to form a signal corresponding to the current to be determined.

After fitment into the installation, the measurement electrode 15 of this sensor and the current conductor 5 form a coupling capacitor for the electric field originating from the current conductor 5 and corresponding t the voltage present while said measurement electrode 15 and the shielding electrode 24 form an auxiliary capacitor which improves the processing and accuracy of the measurement signal which has been coupled in.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A current and voltage transformer (10, 11) for a metal-encapsulated, gas-insulated high-voltage installation having an annular supporting body (13) which can be fixed inside the metal encapsulation (4) and is used for holding a current sensor and a voltage sensor and in which the current sensor, held on the supporting body (13), is constructed as a toroidally wound coil (14) and the voltage sensor, held on the supporting body (13), is constructed as a hollow-cylindrical measurement electrode (15) and in which, after fitment in the installation, the coil (14) and measurement electrode (15) concentrically surround a current conductor (5) of the installation, wherein the coil (14) is wound in the manner of a Rogowski coil on an annular core (29) of non-ferromagnetic material of essentially rectangular cross-section when cut in the axial direction, having a small radial dimension in comparison with the radius of the core (29) and with its axial extent, and is arranged in a hollow-cylindrical space (19) in the supporting body (13), which space is shielded against electric fields and whose boundary wall providing the electrical shielding is connected, after fitment, to the potential of the metal encapsulation (4).

2. The current and voltage transformer as claimed in claim 1, wherein the space (19) is filled with an insulating body (30) which fixes the coil (14).

3. The current and voltage transformer as claimed in claim 2, wherein the insulating body (30) and the core (29) of the coil (14) contain predominantly isotropic material.

4. The current and voltage transformer as claimed in claim 3, wherein the material of the insulating body (30) and of the core (29) of the coil (14) has a coefficient of thermal expansion matched to the material of the metal encapsulation (4).

5. The current and voltage transformer as claimed in claim 3, wherein at least the core (29) is formed by a cured, casting compound of insulating material, filled with spherical particles.

6. The current and voltage transformer as claimed in claim 3, wherein the core (29) contains a non-ferromagnetic metal.

7. The current and voltage transformer as claimed in claim 6, wherein the non-ferromagnetic metal is aluminum.

8. The current and voltage transformer as claimed in claim 1, wherein the supporting body (13) has two shielding electrodes (20, 21) which, after fitment of the transformer into the metal encapsulation (4), are at the potential of the metal encapsulation (4) and which bound the hollow-cylindrical space (19) on its two end faces, and wherein a third shielding electrode (25) is furthermore provided which bounds the space (19) with respect to the current conductor (5) and whose one end face is held in an electrically conducting manner on a first (21), and whose other opposite end face on a second (20), of two shielding electrodes (20, 21), in an electrically insulating manner.

9. The current and voltage transformer as claimed in claim 8, wherein the measurement electrode (15) is electrically insulated and is arranged outside the space (19), at a short distance from the third shielding electrode (25).

10. The current and voltage transformer as claimed in claim 8, wherein the insulating body (30) fixing the coil (14) and the electrical insulation between the measurement electrode (15) and the third shielding electrode (25) are formed from a cured, casting compound.

11. The current and voltage transformer as claimed in claim 8, wherein a material recess, surrounding the current conductor (5), for holding one of the two end faces of the third shielding electrode (25) is fitted at least into the first (21) of the two shielding electrodes (20, 21).

12. The current and voltage transformer as claimed in claim 11, wherein a material recess is fitted into each of the first (21) and second (20) shielding electrodes, of which recesses a first is used to hold an insulation-free end face of the third shielding electrode (25) and a second is used to hold an insulated end face of the third shielding electrode (25).

13. The current and voltage transformer as claimed in claim 12, wherein the material recesses are in each case constructed as a slot (26, 27) and are in each case allocated to one of at least two parts of the supporting body (13), which parts can be assembled.

* * * * *